United States Patent
Chi et al.

(10) Patent No.: US 6,403,443 B1
(45) Date of Patent: Jun. 11, 2002

(54) METHOD FOR REDUCING SURFACE HUMPS OF DOPED AMORPHOUS SILICON LAYER

(75) Inventors: Keh-Fei Chris Chi, Taipei; Chao Hu Liang, Hsinchu Hsien; Kuo-Tung Chu, Taipei; Yu-Lin Tu, Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 27 days.

(21) Appl. No.: 09/632,028

(22) Filed: Aug. 2, 2000

(30) Foreign Application Priority Data

Jul. 24, 2000 (TW) .............................. 89114706

(51) Int. Cl.$^7$ .............................................. H01L 21/20
(52) U.S. Cl. ................... 438/396; 438/398; 438/238; 438/255; 438/240; 438/665; 437/52; 257/306
(58) Field of Search ................... 438/396, 398, 438/238, 255, 240, 665; 437/52; 257/306

(56) References Cited

U.S. PATENT DOCUMENTS

| | | | | |
|---|---|---|---|---|
| 5,362,664 A | * | 11/1994 | Jun | 437/52 |
| 5,478,769 A | * | 12/1995 | Lim | 437/52 |
| 5,959,326 A | * | 9/1999 | Aiso et al. | 257/306 |
| 6,004,859 A | * | 12/1999 | Lin | 438/398 |
| 6,187,629 B1 | * | 2/2001 | Gau et al. | 438/255 |
| 6,211,077 B1 | * | 4/2001 | Shimizu et al. | 438/398 |
| 6,218,230 B1 | * | 4/2001 | Fujiwara et al. | 438/238 |
| 6,218,233 B1 | * | 4/2001 | Takemura | 438/240 |

* cited by examiner

Primary Examiner—John F. Niebling
Assistant Examiner—Olivia T Luk

(57) ABSTRACT

A method for reducing surface hump phenomena of a doped amorphous silicon layer. A dielectric layer is formed on the device, and subsequently, is patterned to form openings for exposure of the electrode surface of the device. A first deposition step is performed to form a conformal first doped amorphous silicon layer in the opening and on the dielectric layer. A second deposition step is performed to form an undoped or a lightly doped amorphous silicon layer on the first doped amorphous silicon layer and filling the openings completely. A third deposition step is performed to form a second doped amorphous silicon layer on the undoped or a lightly doped amorphous silicon layer.

24 Claims, 1 Drawing Sheet

METHOD FOR REDUCING SURFACE HUMPS OF DOPED AMORPHOUS SILICON LAYER

CROSS-REFERENCE TO RELATED APPLICATION

This application claims the priority benefit of Taiwan application serial no. 89114706, filed Jul. 24, 2000.

BACKGROUND OF THIS INVENTION

1. Field of the Invention

This invention relates to a method of fabricating a semiconductor integrated circuit, and more particularly, to a method of reducing surface humps of a doped amorphous silicon layer.

2. Description of Related Prior Art

A capacitor is often used for storing signal in a Dynamic Random Access Memory (DRAM). The more charges a capacitor stores; the less noise (such as soft errors created α particles) and refresh frequency there are in data access.

How to obtain sufficient capacitance in a capacitor is therefore a very important issue for fabricating semiconductors with a line width of 0.25 μm to 0.18 μm or below. One of the popular solutions is to increase the surface area of a capacitor, for example, increases the ruggedness of the surface area of a bottom electrode of a capacitor using hemi-spherical grain (HSG).

A conventional HSG forming process comprises a step of depositing a doped amorphous silicon layer, followed by a step of seeding and annealing. An HSG layer is formed via a re-crystallization process on the surface of the doped amorphous silicon layer.

While forming HSG on the surface of a bottom electrode of a capacitor; first, a metal oxide semiconductor (MOS) is formed underlying a dielectric layer on a substrate. The dielectric layer is then patterned to form contact windows. A doped amorphous silicon layer is deposited in the contact windows and on the dielectric layer, followed by a patterning process to the doped amorphous silicon layer to form HSG on the surface of a bottom electrode, hence to complete the fabrication of a bottom electrode of a capacitor.

A conventional deposition process of a doped amorphous silicon layer is completed in a single deposition step with a deposition gas source of $SiH_4$ or $Si_2H_6$, and a doping gas source of $PH_3$. After deposition of the doped amorphous silicon layer in the contact windows and on the dielectric layer, humps appear at the central areas over the substrate. The number of humps is proportional to the thickness of the doped amorphous silicon layer; i.e., the thicker the doped amorphous silicon layer is, the more humps there are. These humps cause problems for subsequent processes of coating photoresist and photolithography. As a result, the yield of products is affected.

As an example, using $SiH_4$ and $PH_3$ as deposition and doping gas sources at a deposition temperature of 600 degree Celsius to form a doped amorphous silicon layer with a thickness of 3083 angstroms, the number of defects is 99. However, using $Si_2H_6$ and $PH_3$ as deposition and doping gas sources at a deposition temperature of 570 degree Celsius to form a doped amorphous silicon layer with a thickness of 5894 angstroms, the number of defects is 29. If the deposition layer has a thickness of 8382 angstroms, under the same deposition conditions, the number of defects is between 89 to 179. The above data illustrates that the number of defect increases as the deposition thickness of the doped amorphous silicon layer increases. Normally, the number of defect greater than 75 is not acceptable.

SUMMARY OF THIS INVENTION

This invention provides a method for reducing surface humps of a doped amorphous silicon layer.

The method provided by the invention uses three deposition steps to reduce the number of surface humps of a doped amorphous silicon layer.

Furthermore, the invention provides a method using an undoped amorphous silicon layer or a lightly doped amorphous silicon layer to reduce the number of surface humps of a doped amorphous silicon layer.

The invention provides a method for reducing the surface hump phenomena of a doped amorphous silicon layer. A dielectric layer is formed on a substrate comprising several devices. The dielectric layer is patterned to form openings for exposure of a part of an electrode surface of the devices. The method provided by this invention comprises a first deposition step of forming a conformal first amorphous silicon layer in the openings and on the dielectric layer. A second deposition step is performed to form a second amorphous silicon layer on the first amorphous silicon layer and filling the openings. A third deposition step is performed to form a third layer of amorphous silicon layer on the second amorphous silicon layer.

In the above method, preferably, the first and third amorphous silicon layers are doped, while the second amorphous silicon layer is either lightly doped or undoped.

The foregoing first deposition step uses, preferably, $SiH_4$ and $PH_3$ as the deposition and doping gas sources with flow rates between about 800 to about 1000 and about 70 to about 90 sccm (standard cubic centimeter per minute), respectively. The deposition temperature is preferably between about 590 to about 610 degree Celsius, while the pressure of deposition chamber is, preferably, between about 180 to about 220 Torr.

The second deposition step uses, preferably, $SiH_4$ and $PH_3$ as the deposition and doping gas sources with flow rates between about 800 to about 1000 and about 0 to about 35 sccm, respectively. The deposition temperature is preferably between about 590 to about 610 degree Celsius, while the pressure of deposition chamber is, preferably, between about 180 to about 220 Torr.

The third deposition step uses, preferably, $Si_2H_6$ and $PH_3$ as the deposition gas and doping sources with flow rates between about 180 to about 220 and about 260 to about 320 sccm, respectively. The deposition temperature is preferably between about 560 to about 580 degree Celsius, while the pressure of deposition chamber is, preferably, between about 50 to about 70 Torr.

According to the above, this invention has at least the following advantages. Using an undoped amorphous silicon layer, or a lightly doped amorphous silicon layer in the second deposition step to solve surface hump problem at central areas of a wafer after deposition of a doped amorphous silicon layer. The invention also eliminates problem of misalignment in subsequent photolithography and etching process, hence significantly increases the yield of products.

Both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiment, with reference made to the accompanying drawings.

PREFERRED EMBODIMENT

This invention provides a three-step deposition method for solving the well-known surface hump problem and the gap filling problem of a doped amorphous silicon layer.

Figure 1A:
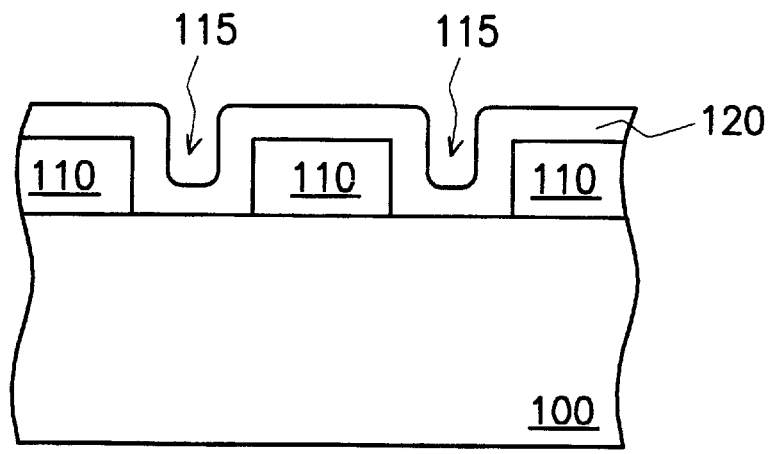
FIGS. 1A–1C are cross sectional views showing an embodiment for reducing surface humps of doped amorphous silicon layer according to the invention.
Figure 1B:
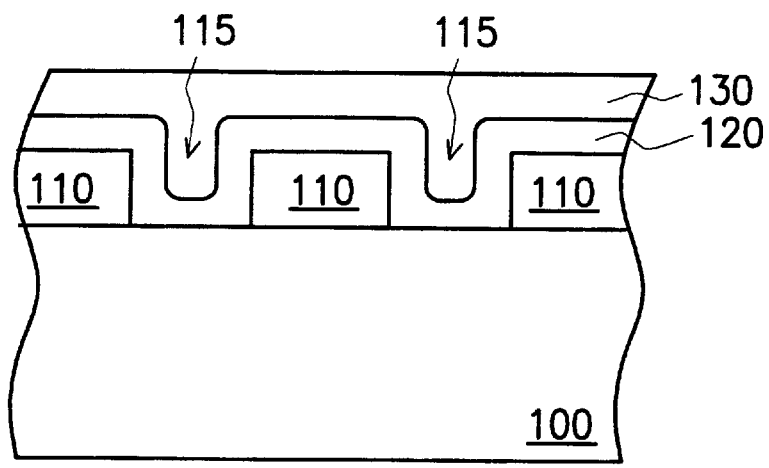
Figure 1C:
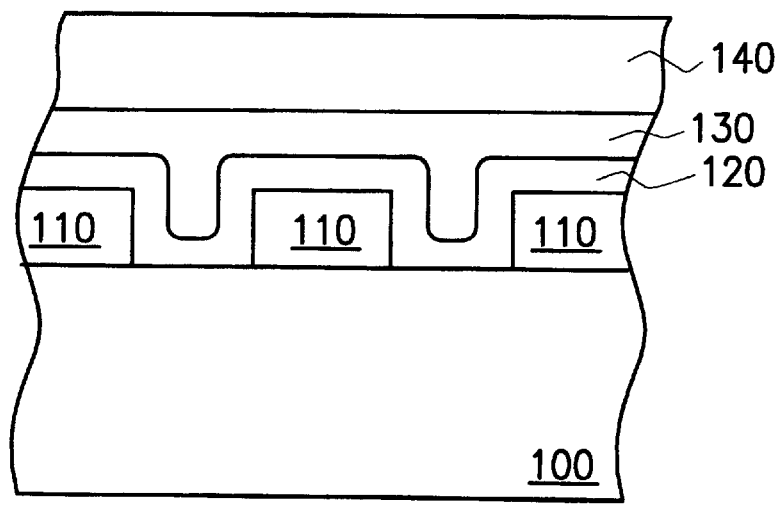

FIGS. 1A–1C are cross sectional views showing an embodiment for reducing surface humps of a doped amorphous silicon layer according to the invention.

In FIG. 1A, devices (not shown) are formed on a substrate 100. A dielectric layer 110 is formed on the substrate 100. The material of dielectric layer 110 includes, for example, silicon oxide, phospho-silicate glass (PSG), boro-phospho-silicate glass (BPSG), spin-on-glass (SOG) or any other suitable dielectric materials. The forming process of the dielectric layer 110 includes, for example, chemical vapor deposition or spin-on coating.

Openings 115 are formed by patterning the dielectric layer 110 via, for example, photolithography and etching, to expose a part of an electrode surface of the devices (not shown).

In the embodiment, a first deposition step is performed to form a first amorphous silicon layer 120 in the openings 115 and on the dielectric layer 110. Preferably, the first amorphous silicon layer 120 is conformal to a surface profile of the substrate 100.

That is, in this embodiment, the amorphous silicon layer 120 is formed along surfaces of the dielectric layer 110 and the openings 115. The ability of gap filling must also be considered at this step to avoid formation of overhangs at upper corners of the openings 115. Therefore, $SiH_4$ is preferably used as the source of silicon particle for the amorphous silicon layer 120 due to its relative good gap filling ability. Since $SiH_4$ is used as the deposition gas source, a higher deposition temperature is required, for example, about 600 degree Celsius. Doping is also required during this step, if an N-type doped amorphous silicon layer is required, as an example, $PH_3$ can be used as the doping gas source.

In FIG. 1B, a second deposition step is performed to form a second amorphous silicon layer 130 on the first amorphous silicon layer 120. As shown in FIG. 1A, the openings 115 are not completely filled in the first deposition step. In the second deposition step, as the ability of gap filling is to be considered, $SiH_4$ is used as the source of the silicon particle to form the second amorphous silicon layer 130 for filling the openings 115. Another consideration at the second deposition step is whether a step of lightly doping to lower the resistance of the whole doped amorphous silicon layer is performed. If this step is required, and an N-type doped layer is to be formed, for example, $PH_3$ can be used as the doping gas source.

In FIG. 1C, a third deposition step forming a third amorphous silicon layer 140 on the second amorphous silicon layer 130 is performed. Since the openings 115 have been filled completely by the second deposition step, the ability of gap filling is not a consideration at this step. Therefore, as an example, $Si_2H_6$ can be used as the source of silicon particle and the deposition can be carried out at a higher deposition rate. A lower deposition temperature of about 570 degree Celsius can also be used. The third amorphous silicon layer 140 is preferably doped during the third deposition step. If an N-type doping is required, for example, $PH_3$ is used as the doping gas source.

In the above paragraph describing the second deposition step, the necessity of doping the second amorphous silicon layer 130 is discussed here. Table 1 shows the deposition conditions including the doping parameters for each deposition step. Table 2 shows experimental results including the sheet resistance, the number of defects and the distribution of defects for each testing module. From the experimental results, it is found that by reducing the amount of dopant, or even keep the second amorphous silicon layer 130 undoped, the number of surface humps distributed around the center areas of the wafer is effectively decreased.

TABLE 1

Deposition Parameters of Doped Amorphous silicon layer

| Module No. | Deposition Parameters | Step 1 | Step 2 | Step 3 |
|---|---|---|---|---|
| 1 | Deposition Temperature (° C.) | 600 | 600 | 570 |
|   | Pressure of Deposition Chamber (Torr) | 200 | 200 | 60 |
|   | Deposition Time (second) | 10 | — | — |
|   | $SiH_4$ (sccm) | 900 | 900 | — |
|   | $Si_2H_6$ (sccm) | — | — | 200 |
|   | $PH_3$ (sccm) | — | 80 | 290 |
| 2 | Deposition Temperature (° C.) | 600 | 600 | 570 |
|   | Pressure of Deposition Chamber (Torr) | 200 | 200 | 60 |
|   | Deposition Time (second) | — | 20 | — |
|   | $SiH_4$ (sccm) | 900 | 900 | — |
|   | $Si_2H_6$ (sccm) | — | — | 200 |
|   | $PH_3$ (sccm) | 80 | — | 290 |
| 3 | Deposition Temperature (° C.) | 600 | 600 | 570 |
|   | Pressure of Deposition Chamber (Torr) | 200 | 200 | 60 |
|   | Deposition Time (second) | — | 10 | — |
|   | $SiH_4$ (sccm) | 900 | 900 | — |
|   | $Si_2H_6$ (sccm) | — | — | 200 |
|   | $PH_3$ (sccm) | 80 | — | 290 |
| 4 | Deposition Temperature (° C.) | 600 | 600 | 570 |
|   | Pressure of Deposition Chamber (Torr) | 200 | 200 | 60 |
|   | Deposition Time (second) | — | 4 | — |
|   | $SiH_4$ (sccm) | 900 | 900 | — |
|   | $Si_2H_6$ (sccm) | — | — | 200 |
|   | $PH_3$ (sccm) | 80 | — | 290 |
| 5 | Deposition Temperature (° C.) | 600 | 600 | 570 |
|   | Pressure of Deposition Chamber (Torr) | 200 | 200 | 60 |
|   | Deposition Time (second) | — | 20 | — |
|   | $SiH_4$ (sccm) | 900 | 900 | — |
|   | $Si_2H_6$ (sccm) | — | — | 200 |
|   | $PH_3$ (sccm) | 80 | 10 | 290 |
| 6 | Deposition Temperature (° C.) | 600 | 600 | 570 |
|   | Pressure of Deposition Chamber (Torr) | 200 | 200 | 60 |
|   | Deposition Time (second) | — | 10 | — |
|   | $SiH_4$ (sccm) | 900 | 900 | — |
|   | $Si_2H_6$ (sccm) | — | — | 200 |
|   | $PH_3$ (sccm) | 80 | 10 | 290 |
| 7 | Deposition Temperature (° C.) | 600 | 600 | 570 |
|   | Pressure of Deposition Chamber (Torr) | 200 | 200 | 60 |
|   | Deposition Time (second) | — | 20 | — |
|   | $SiH_4$ (sccm) | 900 | 900 | — |
|   | $Si_2H_6$ (sccm) | — | — | 200 |
|   | $PH_3$ (sccm) | 80 | 40 | 290 |

TABLE 2

Results of Modules from Table 1

| Module No. | Thickness (angstroms) | Concentration of phosphorus ($\times 10^{20}/cm^3$) | Sheet Resistance (Standard Deviation %) | No. of Defects | Distribution Of Defects No. |
|---|---|---|---|---|---|
| 1 | 8440 | 1.01 | NA* | 202 | Random |
| 2 | 8714 | 1.09 | NA* | 59 | Random |
| 3 | 8482 | 1.02 | 17.7 (3.73) | 44 | Random |
| 4 | 8470 | 1.02 | 17.7 (3.82) | 29 | Random |
| 5 | 8665 | 1.02 | 17.6 (4.35) | 58 | Random |
| 6 | 8495 | 1.02 | 17.5 (3.51) | 59 | Random |
| 7 | 8733 | 1.02 | 16.8 (3.49) | 87 | Random |

*Not Available

Measured by a KLA test equipment. The equipment used laser beam to scan the surface of wafer in order to detect, and subsequent to calculate, the distribution of defects.

In Table 1, the deposition conditions for the first and the second deposition steps of module 3 are interchanged from those of module 1. Table 2 shows the number of defects reduced significantly without doping the second amorphous silicon layer, or with lightly dopant thereof in the second deposition step (In module 3, the number of defects is decreased from 202 (of module 1) to 44 for not doping at all).

Modules 2 to 4 in Table 1 show that, the second deposition step does not include a step of doping. However, as deposition time gradually shortens from 20 seconds, 10 seconds to 4 seconds, the number of defects is reduced from 59, 44 to 29, respectively.

However, it is unknown whether the sheet resistance of the whole amorphous silicon layer stack is adversely affected without performing a doping step on the second amorphous layer. Modules 5 and 6 in Table 1 are carried out to find out the effects. The second deposition steps of modules 5 and 6 include lightly doping steps with a deposition time of 20 and 10 seconds, respectively. Table 2 shows no significant differences in the number of defects being found (58 in module 5 and 59 in module 6). In addition, the sheet resistance of modules 5 and 6 show no major difference when comparing with the sheet resistance of module 3 and 4.

By continuously increasing the doping concentration of the second deposition step, module 7 in Table 1 is tested, and the doping concentration of the second deposition step is four times the amount and twice the deposition time of module 5 and 6. Table 2 shows that the number of defects increased to 87; hence, the doping concentration in the second deposition step cannot be too high.

From the experimental data as shown in Tables 1 and 2, preferably, in this embodiment, the doping concentration of the second deposition step is lower than that of the first deposition step, while the doping concentration of the first deposition step is lower than that of the third deposition step.

Concerning the sheet resistance of each module, except that the measurement of sheet resistance is not performed on modules 1 and 2, the remaining modules have magnitudes between about 16 to about 18 Ohms per square which are within the acceptable range. Accordingly, in the method provided by this invention, even with a second deposition step which is not doped or lightly doped, the sheet resistance of the (second) doped amorphous silicon layer is affected adversely.

Another point to note is that conventional deposition method leaves a large number of surface humps around the center areas of the wafer, and this causes misalignments in subsequence photolithography step, and resulting a product failure of chip. Table 2 shows that the method provided by this invention does not only reduce the number of surface humps of a doped amorphous silicon layer, but also spreads the surface humps randomly all over the wafer surface. Hence, the invention prevents the surface humps from distributing at the center areas of the wafer; and improves the yield of chip significantly.

From the discussions of Tables 1 and 2 above, the occurrence of the surface humps is because, presumably, of dopant diffusing within the doped amorphous silicon, or even out over the surface thereof, under high deposition temperature. This dopant diffusion effect is similar to out-gassing problem while forming a conductive plug.

Hence, after forming the first doped amorphous silicon layer by the first deposition, the second amorphous silicon layer formed by the second deposition step, which fills the openings of the dielectric layer, is preferably not to be doped or only lightly doped. As a result, dopant concentration of the doped amorphous silicon layer in the openings of the dielectric layer is not too high. In addition, the second amorphous silicon layer functions as a dopant absorber to prevent problems similar to out-gassing that forms the surface humps. Concerning the third deposition step, since the openings in the dielectric layer have been completely filled, this step can be performed without worrying about formation of the surface humps.

Tables 1 and 2 conclude that the first deposition step, preferably, uses $SiH_4$ and $PH_3$ as the deposition and doping gas sources with flow rates between about 800 to about 1000 and about 70 to about 90 sccm, respectively. The deposition temperature is preferably between about 590 to about 610 degree Celsius while the pressure of deposition chamber is, preferably, between about 180 to about 220 Torr.

The second deposition step uses, preferably, $SiH_4$ and $PH_3$ as the deposition and doping gas sources with flow rates between about 800 to about 1000 and about 0 to about 35 sccm, respectively. The deposition temperature is preferably between about 590 to about 610 degree Celsius while the pressure of deposition chamber is, preferably, between about 180 to about 220 Torr.

The third deposition step uses, preferably, $Si_2H_6$ and $PH_3$ as the deposition and doping gas sources with flow rates between about 180 to about 220 and about 260 to about 320 sccm, respectively. The deposition temperature is preferably between about 560 to about 580 degree Celsius while the pressure of deposition chamber is, preferably, between about 50 to about 70 Torr.

From the above embodiment, the invention comprises at least the following advantages:
 (1) Reducing the number of surface humps around the center areas of wafer from deposition of a lightly doped or an undoped amorphous silicon layer to fill the openings, so that a planar surface can be obtained. It is thus advantageous to prevent problem of misalignment in subsequence photolithography and etching step.
 (2) Preventing a concentration of surface humps in the center area of wafer and spreading the surface humps randomly all over the wafer surface so to improve the yield of a product.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for reducing surface humps of a doped amorphous silicon layer, wherein a substrate comprising an electrode surface is provided, a dielectric layer is formed to cover the substrate and the electrode surface, and at least an opening is formed in the dielectric layer to expose the electrode surface, the method comprising:
- a first deposition step to form a conformal first doped amorphous silicon layer along a surface profile of the substrate;
- a second deposition step to form a second amorphous silicon layer on the first doped amorphous silicon layer and filling the opening; and
- a third deposition step to form a third amorphous silicon layer on the second amorphous silicon layer; wherein
- a dopant concentration of the second amorphous silicon layer is lower than those of the first and the third amorphous silicon layers.

2. The method according to claim 1, wherein the first deposition step comprises a step of forming a doped amorphous silicon layer with gas sources of $SiH_4$ and $PH_3$ and flow rates between about 800 to about 1000 and about 70 to about 90 sccm, respectively.

3. The method according to claim 1, wherein the first deposition step comprises a step of forming a doped amorphous silicon layer as the first amorphous silicon layer at a temperature between about 590 to about 610 degree Celsius.

4. The method according to claim 1, wherein the first deposition step comprises a step of forming a doped amorphous silicon layer as the first amorphous silicon layer with a deposition chamber pressure between about 180 to about 220 Torr.

5. The method according to claim 1, wherein the second deposition step comprises a step of forming the second amorphous silicon layer with gas source $SiH_4$ and a flow rate between about 800 to about 1000 sccm.

6. The method according to claim 1, wherein the second deposition step comprises a step of forming the second amorphous silicon layer at a temperature between about 590 to about 610 degree Celsius.

7. The method according to claim 1, wherein the second deposition step comprises a step of forming the second amorphous silicon layer at a deposition chamber pressure between about 180 to about 220 Torr.

8. The method according to claim 1, wherein the second deposition step comprises a step of forming the second amorphous silicon layer using gas sources $SiH_4$ and $PH_3$ with flow rates between about 800 to about 1000 and about 0 to about 35 sccm, respectively.

9. The method according to claim 1, wherein the third deposition step comprises a step of forming a doped amorphous silicon layer as the third amorphous silicon layer with gas sources $Si_2H_6$ and $PH_3$ and flow rates between about 180 to about 220 and about 260 to about 320 sccm, respectively.

10. The method according to claim 1, wherein the third deposition step comprises a step of forming a doped amorphous silicon layer as the third amorphous silicon layer at a temperature between about 560 to about 580 degree Celsius.

11. The method according to claim 1, wherein the third deposition step comprises a step of forming a doped amorphous silicon layer as the third amorphous silicon layer at a deposition chamber pressure between about 50 to about 70 Torr.

12. The method according to claim 1, wherein the second amorphous silicon layer is undoped, while the first and the third amorphous silicon layers are doped.

13. The method according to claim 1, wherein the second amorphous silicon layer is lightly doped, while the first and the third amorphous silicon layers are more heavily doped compared to the second amorphous silicon layer.

14. The method according to claim 1, wherein the first amorphous silicon layer is doped with a concentration lower than that of the third amorphous silicon layer and higher than that of the second amorphous silicon layer.

15. A method for reducing surface humps of a doped amorphous silicon layer, wherein a substrate comprising an electrode surface is provided, a dielectric layer is formed to cover the substrate and the electrode surface, and at least an opening is formed in the dielectric layer to expose the electrode surface, the method comprising:
- forming a conformal first doped amorphous silicon layer along a surface profile of the dielectric layer, the first doped amorphous silicon layer being in contact with the electrode surface;
- forming an undoped or lightly doped amorphous silicon layer on the first doped amorphous silicon layer and filling the opening; and
- forming a second doped amorphous silicon layer on the undoped or lightly doped amorphous silicon layer.

16. The method according to claim 15, wherein a first deposition step using gas sources $SiH_4$ and $PH_3$ with flow rates between about 800 to about 1000 and about 70 to about 90 sccm, respectively is performed in the step of forming the first doped amorphous silicon layer.

17. The method according to claim 15, wherein a first deposition step at a temperature between about 590 to about 610 degree Celsius is performed in the step of forming the first doped amorphous silicon layer.

18. The method according to claim 15, wherein a first deposition step at a deposition chamber pressure between about 180 to about 220 Torr is performed in the step of forming the first doped amorphous silicon layer.

19. The method according to claim 15, wherein a second deposition step using gas sources $SiH_4$ and $PH_3$ with flow rates between about 800 to about 1000 and about 0 to about 35 sccm, respectively performed in the step of forming the second amorphous silicon layer.

20. The method according to claim 15, wherein a second deposition step at a temperature between about 590 to about 610 degree Celsius is performed in the step of forming the undoped or lightly amorphous silicon layer.

21. The method according to claim 15, wherein a second deposition step at a deposition chamber pressure between about 180 to about 220 Torr is performed in the step of forming the undoped or lightly amorphous silicon layer.

22. The method according to claim 15, wherein a third deposition step using gas source $Si_2H_6$ and $PH_3$ with flow rates between about 180 to about 220 and about 260 to about 320 sccm, respectively is performed in the step of forming the second doped amorphous silicon layer.

23. The method according to claim 15, wherein a third deposition step at a temperature between about 560 to about 580 degree Celsius is performed in the step of forming the second doped amorphous silicon layer.

24. The method according to claim 15, wherein a third deposition step at a deposition chamber pressure between about 50 to about 70 Torr is performed in the step of forming the second doped amorphous silicon layer.

* * * * *